United States Patent
Tiwari et al.

(10) Patent No.: US 10,403,618 B2
(45) Date of Patent: Sep. 3, 2019

(54) EDGE CUT DEBOND USING A TEMPORARY FILLER MATERIAL WITH NO ADHESIVE PROPERTIES AND EDGE CUT DEBOND USING AN ENGINEERED CARRIER TO ENABLE TOPOGRAPHY

(71) Applicant: Micron Technology, Inc., Boise, ID (US)

(72) Inventors: Chandra S. Tiwari, Boise, ID (US); Tony M. Lindenberg, Boise, ID (US); Jonathan S. Hacker, Meridian, ID (US); Christopher J. Gambee, Caldwell, ID (US); Kurt J. Bossart, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/711,937

(22) Filed: Sep. 21, 2017

(65) Prior Publication Data
US 2019/0088637 A1    Mar. 21, 2019

(51) Int. Cl.
*H01L 25/00* (2006.01)
*H01L 23/00* (2006.01)
*H01L 21/02* (2006.01)

(52) U.S. Cl.
CPC ........ *H01L 25/50* (2013.01); *H01L 21/02021* (2013.01); *H01L 21/02076* (2013.01); *H01L 24/03* (2013.01); *H01L 24/71* (2013.01)

(58) Field of Classification Search
None
See application file for complete search history.

(56) References Cited

U.S. PATENT DOCUMENTS

2015/0001686 A1* 1/2015 Xue .................... H01L 23/3114
257/621

* cited by examiner

*Primary Examiner* — Long Pham
(74) *Attorney, Agent, or Firm* — Parsons Behle & Latimer

(57) ABSTRACT

A semiconductor device assembly that includes a first side of a semiconductor device supported on a substrate to permit the processing of a second side of the semiconductor device. A filler material deposited on the semiconductor device supports the semiconductor device on the substrate. The filler material does not adhere to the semiconductor device or the substrate. Alternatively, the filler material may be deposited on the substrate. Instead of a filler material, the substrate may include a topography configured to support the semiconductor device. Adhesive applied between an outer edge of the first side of the semiconductor and the substrate bonds the outer edge of the semiconductor device to the substrate to form a semiconductor device assembly. A second side of the semiconductor device may then be processed and the outer edge of the semiconductor device may be cut off to release the semiconductor device from the assembly.

17 Claims, 6 Drawing Sheets

EDGE CUT DEBOND USING A TEMPORARY FILLER MATERIAL WITH NO ADHESIVE PROPERTIES AND EDGE CUT DEBOND USING AN ENGINEERED CARRIER TO ENABLE TOPOGRAPHY

FIELD

The embodiments described herein relate to semiconductor device assemblies and methods of forming a semiconductor device assembly.

BACKGROUND

A substrate, such as a carrier wafer, is often used to support a semiconductor device, such as a semiconductor wafer that includes a plurality of dies, to permit further processing on the semiconductor device. For example, a semiconductor device may include a plurality of structures, such as pads, pillars, and/or vias, on a first or front side of the device. During the processing of the semiconductor device, the thickness of the semiconductor device may need to be reduced. Various processes, such as, but not limited to, chemical mechanical planarization, grinding, and/or dry etching, may be applied to the back or second side of the semiconductor device to remove material from the semiconductor device. For example, the thickness of the semiconductor device may be reduced from 775 microns down to 70 microns using various processes known by one of ordinary skill in the art.

Presently, a semiconductor device, such as a semiconductor wafer, may be temporarily bonded to a substrate, such as a carrier wafer, with a temporary adhesive to form a temporary semiconductor device assembly. For example, the first or front side of the semiconductor wafer may be bonded to a carrier wafer with a temporary adhesive that is spin coated onto the carrier wafer. After completing the processing on the second or back side of the semiconductor wafer, the semiconductor wafer is removed from the carrier wafer. Typically, the semiconductor wafer is removed or debonded from the carrier wafer by thermal/mechanical sliding. In other words, the temporary semiconductor device assembly is heated and force is applied to slide the semiconductor wafer off the carrier wafer. The present process of removing the semiconductor wafer from the carrier wafer may result in, among other things, die cracking and/or pillar smearing. Further, the present process may result in breakage of the semiconductor wafer itself. The edges of the semiconductor wafer may break, crack, or chip during the removal/debonding process.

The term "temporary adhesive," as used herein, means an adhesive and/or epoxy that has a glass transition temperature, Tg, of 150 degrees Celsius or less. The Tg is the temperature at which the adhesive and/or epoxy transitions from a hard, glassy material to a soft, rubbery material. An adhesive is used to temporarily bond the semiconductor device to the substrate. The semiconductor device is temporarily bonded to the substrate as the semiconductor device may be removed from the substrate after the requisite processing is completed. In order to ensure that the semiconductor device may be removed from the substrate, a temporary adhesive is often used to temporarily bond the semiconductor device to the substrate rather than a stronger more permanent adhesive. However, the temperature during some of the processes applied to the semiconductor device and substrate assembly often may exceed the Tg of the adhesive used to temporarily bond the semiconductor device to the substrate, whether a "temporary" adhesive is used or not, which may cause the adhesive to move and/or squeeze out from between the semiconductor device and the substrate assembly. The movement of the adhesive may result in the surfaces of the semiconductor device assembly being non-planar, which may be problematic as would be appreciated by one of ordinary skill in the art.

Additional drawbacks and disadvantages may exist.

Figure 1A:
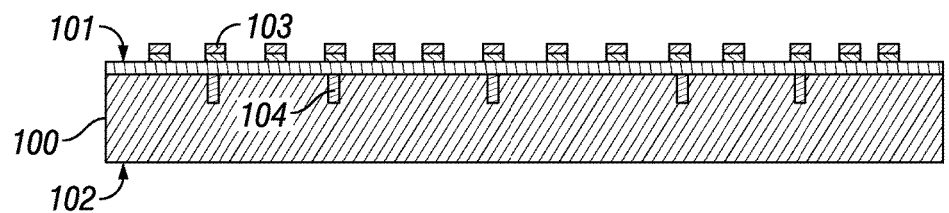
FIGS. 1A-1H show various elements of one embodiment of a temporary semiconductor device assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor wafer, but semiconductor devices are not limited to semiconductor wafers.

As used herein, the terms "vertical," "lateral," "upper," and "lower" can refer to relative directions or positions of features in the semiconductor devices shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/ below, up/down, and left/right can be interchanged depending on the orientation.

Various embodiments of this disclosure are directed to semiconductor devices, semiconductor device assemblies, and methods of making and/or operating semiconductor devices. In one embodiment of the disclosure a filler material is applied onto a first side of a semiconductor device and the first side of the semiconductor is positioned adjacent to a substrate. The filler material supports the semiconductor device on the substrate. An adhesive is applied between an outer edge of the first side of the semiconductor and the substrate to bond the outer edge of the semiconductor device to the substrate to form a semiconductor device assembly. A second side of the semiconductor device may then be processed and the outer edge of the semiconductor device may be cut off to release the semiconductor device from the assembly after completion of processing on the second side of the semiconductor device.

In one embodiment of the disclosure a filler material is applied onto a first side of a substrate and a first side of the semiconductor is positioned adjacent to the first side of the substrate. The filler material supports the semiconductor device on the substrate. An adhesive is applied between an outer edge of the first side of the semiconductor and the substrate to bond the outer edge of the semiconductor device to the substrate to form a semiconductor device assembly. A second side of the semiconductor device may then be processed and the outer edge of the semiconductor device may be cut off to release the semiconductor device from the assembly after completion of processing on the second side of the semiconductor device.

In one embodiment of the disclosure, a first side of a substrate includes a topography that substantially corresponds to a topography of a first side of semiconductor device. The topography provides projections to support the semiconductor device on the substrate while providing air gaps between the substrate and various structures and/or features on the first side of the semiconductor device. An adhesive is applied between an outer edge of the first side of the semiconductor and the substrate to bond the outer edge of the semiconductor device to the substrate to form a semiconductor device assembly. A second side of the semiconductor device may then be processed and the outer edge of the semiconductor device may be cut off to release the semiconductor device from the assembly after completion of processing on the second side of the semiconductor device.

FIG. 1A shows a semiconductor device 100 having a front or first side 101 and a back or second side 102. The semiconductor device 100 may be a semiconductor wafer comprised of a plurality of dies as would be appreciated by one of ordinary skill in the art having the benefit of this disclosure. The first side 101 of the semiconductor device 100 may include a topography comprised of various structures as would be appreciated by one of ordinary skill in the art. FIG. 1A shows a plurality of pads 103 and vias 104, whereas the vias 104 do not extend the entire width of the semiconductor device 100 to the second side 102. The topography on the first side 101 of the semiconductor device 100 is shown for illustrative purposes only and the features and the shapes, configurations, and/or locations of the features may be varied depending on the application as would be appreciated by one of ordinary skill in the art having the benefit of this disclosure.

Figure 1B:
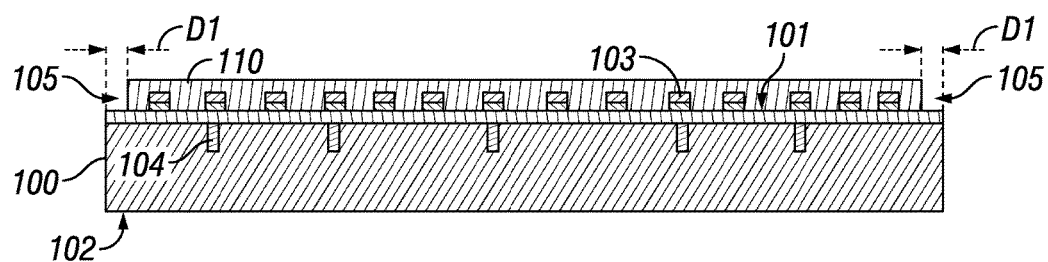

FIG. 1B shows the semiconductor device 100 of FIG. 1A with a temporary filler material, as referred to herein as filler material, 110 on the first or front side 101 of the semiconductor device 100. The filler material 110 does not cover the entire first side 101 of the semiconductor device 100 as shown in FIG. 1B. Rather, an edge 105 of the first side 101 of the semiconductor device 100 is free of the filler material 110. The edge 105 free from the filler material 110 may have a distance, D1, from the edge of first side 101 of the semiconductor device 100. The distance, D1, may be 5 millimeters or less. For example, the distance, D1, may be three (3) millimeters, two (2) millimeters, or less. The distance, D1, may be varied depending on the application as discussed herein.

Filler material 110 may be applied to the first side 101 of the semiconductor device 100 in such a way that filler material 110 does not occupy the edge 105 of the first side 101 of the semiconductor device 100 as discussed herein, and as would be appreciated by one of ordinary skill in the art having the benefit of this disclosure. Alternatively, a portion of the filler material 110 may be removed after being deposited onto the first side 101 of the semiconductor device 100. For example, a portion of the filler material 110 may be removed via a vacuum to create the edges 105 free of the filler material 110. Various other processes and/or mechanism may be used to remove the filler material 110 or keep the edges 105 free of the filler material 110 as would be appreciated by one of ordinary skill in the art having the benefit of this disclosure.

The filler material 110 may be comprised of various materials and may be a small particle powder coating. The filler material 110 does not adhere to the first side 101 of the semiconductor device 100 and does not adhere to the substrate 120 (shown in FIG. 1D), as discussed herein. The filler material 110 may be a non-compressive material. The filler material 110 may be a non-fluid material. The filler material 110 may be a powder that is non-compressible and provides support for the semiconductor 100 on the substrate 120 when formed as a semiconductor device assembly 150 (as shown in FIG. 1D), as discussed herein.

The filler material 110 may be a granular, non-adhesive material that fills the space between the semiconductor device 100 and the substrate 120 when formed as a semiconductor device assembly 150. Pressure may be applied to the semiconductor device assembly 150 to ensure that the filler material 110 adequately fills the space between the semiconductor device 100 and the substrate 120. The filler material 110 may not chemically bond to either the semiconductor device 100 or the substrate 120. The filler material 110 may have a low-strength bond with itself to aid in forming a supporting structure within the semiconductor device assembly 150, as discussed herein. For example, the filler material may include a weak binding material to aid in the filler material 110 retaining a shape when deposited onto the semiconductor device 110 and/or the substrate 120. Various materials may be used as the filler material 110 as would be appreciated by one of ordinary skill in the art having the benefit of this disclosure. For example, the filler material 110 may be, but is not limited to, a fine powder made from quartz, talcum, plastic, ceramic, composites, and/or a combination of these and/or other materials.

Figure 1C:
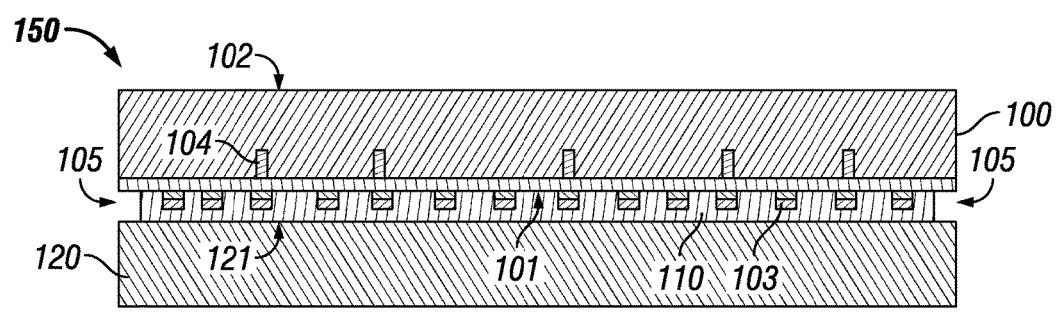

FIG. 1C shows a semiconductor device assembly 150 comprised of the semiconductor device 100 supported on a top or first surface 121 of a substrate 120 by the filler material 110. As discussed above, an outer edge 105 of the semiconductor device 100 is left free of the filler material 110. The filler material 110 fills the space between the semiconductor device 100 and the substrate 120 and supports the semiconductor device 100 on the substrate 120.

Figure 1D:
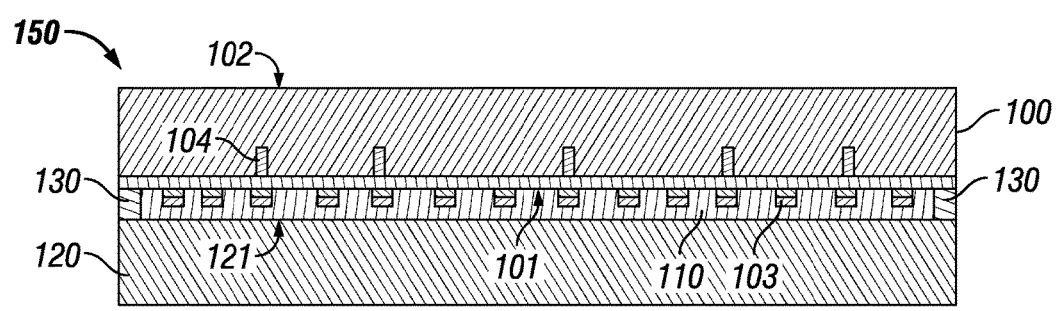

FIG. 1D shows the semiconductor device assembly 150 of FIG. 1C with adhesive 130 bonding the semiconductor device 100 to the substrate 120. The adhesive 130 is applied at the outer edge 105 of the semiconductor device 100. The adhesive 130 may be a stronger adhesive than the temporary adhesive used to temporarily bond an entire side of a semiconductor wafer to a carrier wafer, as discussed herein. The adhesive 130 may be a permanent adhesive. The term "permanent adhesive," as used herein, means an adhesive and/or epoxy that has a glass transition temperature, Tg, of above 150 degrees Celsius. In one embodiment, the adhesive may have a transition temperature, Tg, of 180 degrees Celsius or above. In one embodiment, the adhesive may have a transition temperature, Tg, of 200 degrees Celsius or above.

The adhesive 130, which may be a ring of adhesive, selectively bonds the semiconductor device 100 and substrate 120 together to form a semiconductor device assembly 150. The adhesive 130 only bonds the outer edge of the semiconductor device 100 to the substrate 120, whereas the filler material 110 provides support between the semiconductor device 100 and the substrate 120. The second or back side 102 of the semiconductor 100 may then be processed after the adhesive 130 bonds the semiconductor device 110 to the substrate 120 to form a semiconductor device assembly 150.

Figure 1E:
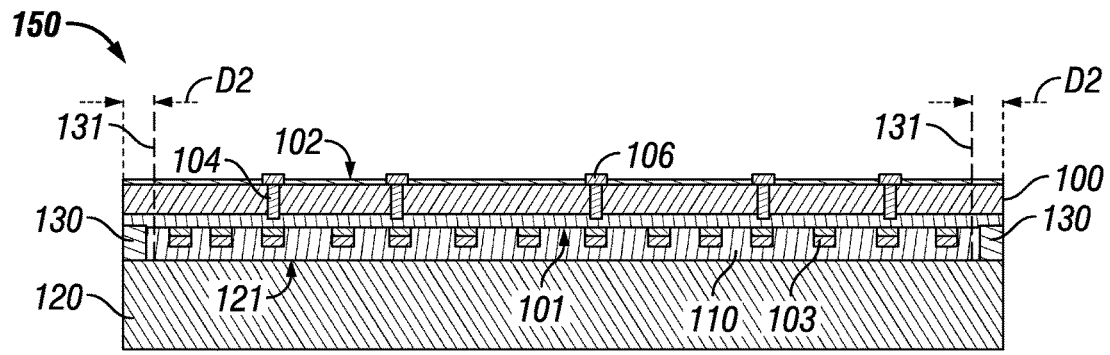

FIG. 1E shows the semiconductor device assembly 150 after processing has reduced the thickness of the semiconductor device 100. As discussed above, various processes may be used to remove material from the second or back side 102 of the semiconductor device 100. The second or back side 102 of the semiconductor device 100 may now include pads 106 connected to vias 104, as shown in FIG. 1E. The various shape, location, and/or configuration of the various features and/or structures on the first and second sides 101, 102 of the semiconductor device 100 are shown for illustrative purposes and may be varied within the scope of the disclosure as would be appreciated by one of ordinary skill in the art having the benefit of this disclosure. A portion of the semiconductor device 100 may be cut away to permit the semiconductor device to be removed from the semiconductor device assembly 150.

For example, the semiconductor device 100 may be cut at each end at line 131. The semiconductor device 100 may be cut at a distance, D2, from the edge of the semiconductor device 100 to permit the semiconductor device 100 from the semiconductor device assembly 150. The distance, D2, may be equal to the distance, D1, which is the distance that the adhesive 130 is present from the edge of the semiconductor device 100. The distance, D2, may be slightly larger than the distance, D1, to ensure that the semiconductor device 100 may be removed from the semiconductor devices assembly 150. For example, the distance, D2, may be one (1) millimeter larger than the distance, D1. The distances, D1, and D2 shown on FIG. 1B and FIG. 1E, respectfully, are shown for clarity purposes only and thus, may not be drawn to scale. The distance, D1, of the adhesive from the outer edge of the semiconductor device 100 and the distance, D2, that the semiconductor device 100 is cut from the outer edge of the semiconductor device 100 may be varied within the scope of this disclosure as would be appreciated by one of ordinary skill in the art having the benefit of this disclosure.

For example, the distance, D1, may be potentially be reduced as the strength of the adhesive increases. Likewise, the distance, D2, may change based on the distance, D1.

Figure 1F:
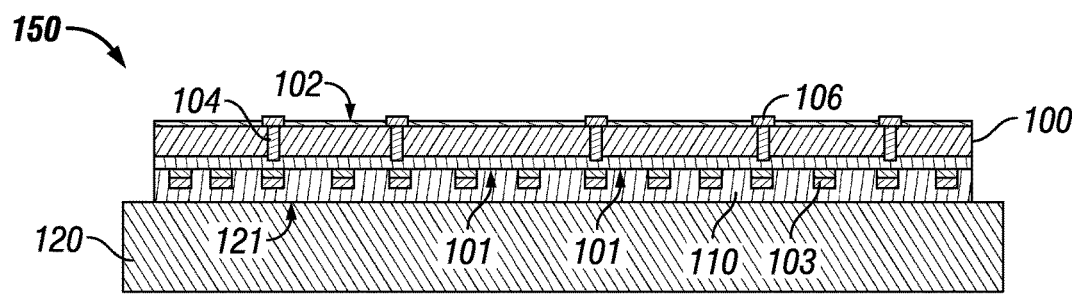
Figure 1G:
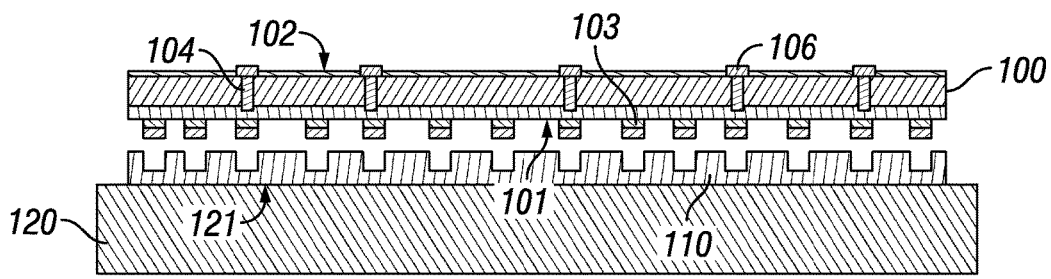
Figure 1H:
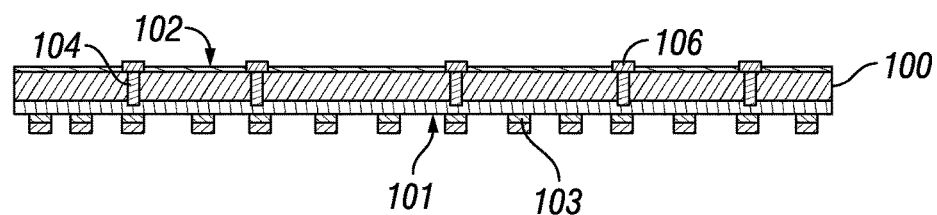

FIG. 1F shows the semiconductor device assembly 150 with a portion of the outer edge of the semiconductor 100 removed. Various methods may be used to remove the outer portion of the semiconductor 100 as would be appreciated by one of ordinary skill in the art having the benefit of this disclosure. With the outer edge having the adhesive 130 cut from the semiconductor device 100, the semiconductor device 100 may be moved away from the substrate 120, as shown in FIG. 1G. As discussed herein, the filler material 110 does not adhere to and/or bond to the semiconductor device 100 permitting the semiconductor device 100 to be moved away from the substrate 120 after the outer portion of the semiconductor device 100 that was bonded to the substrate 120 by the adhesive 130 has been cut off. FIG. 1H shows the semiconductor device 100 after it has been removed from the semiconductor device assembly 150. Various cleaning processes may need to be applied to the semiconductor device 100 after it has been removed from the semiconductor device assembly 150.

Figure 2A:
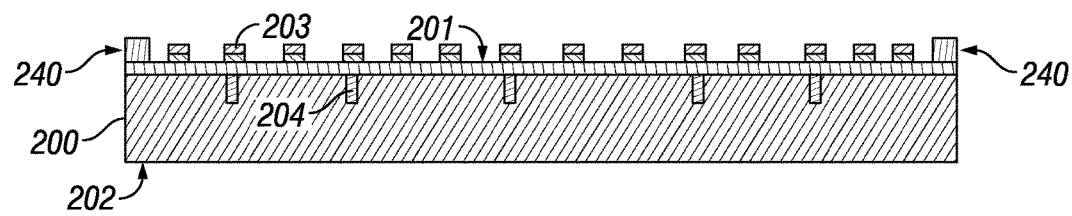
FIGS. 2A-2B show various elements of one embodiment of a temporary semiconductor device assembly.
Figure 2B:
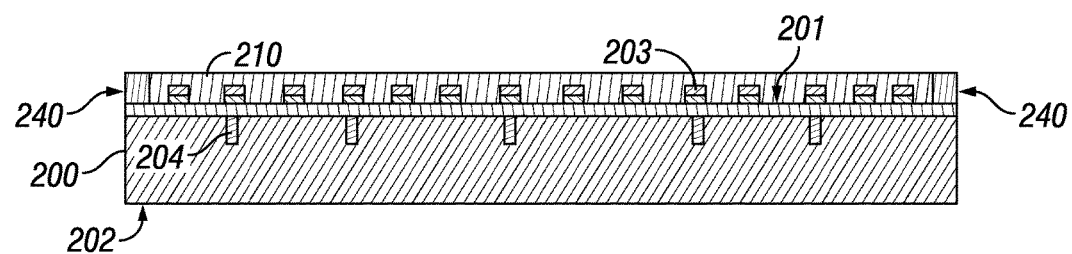

FIG. 2A shows an embodiment of a semiconductor device 200 that includes a ring 240 that is positioned on the outer edge of the first or top surface 201 of the semiconductor device 200. The first or top surface 201 of the semiconductor device 200 may include various structures, such as pads 203 and vias 204, that provide a topography on the first side 201 of the semiconductor device 200, as discussed herein. The pads 203 and vias 204 are shown for illustrative purposes only. Filler material 210 may be applied to the first side 201 of the semiconductor device 200, as discussed herein. The ring 240 may retain the filler material 210 and prevent the filler material 210 from covering the outer edge of the first surface 201 of the semiconductor device 200. The ring 240 may then be removed providing an edge of the first surface 201 of the semiconductor device 200 upon which the filler material is absent, similar to 105 shown in FIG. 1B.

A substrate may then be positioned adjacent to the first side 201 of the semiconductor device 200, as discussed herein. Alternatively, the ring 240 may be removed from the first side 201 of the semiconductor device 200 after the substrate is positioned adjacent to the first side 201 of the semiconductor device 200. A ring of adhesive may then be applied to the outer edge of the first side 201 of the semiconductor device 200 to bond the semiconductor device 200 to a substrate to form a semiconductor device assembly, as discussed herein. The second side 202 of the semiconductor device 200 may then be processed with the filler material 210 supporting the first side 201 of the semiconductor device 200 on a substrate, as discussed herein.

Figure 3A:
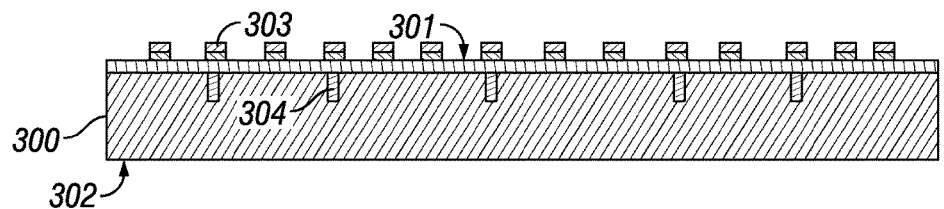
FIGS. 3A-3D show various elements of one embodiment of a temporary semiconductor device assembly.
Figure 3B:
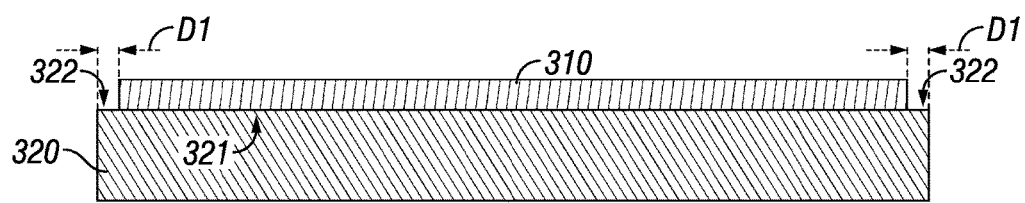
Figure 3C:
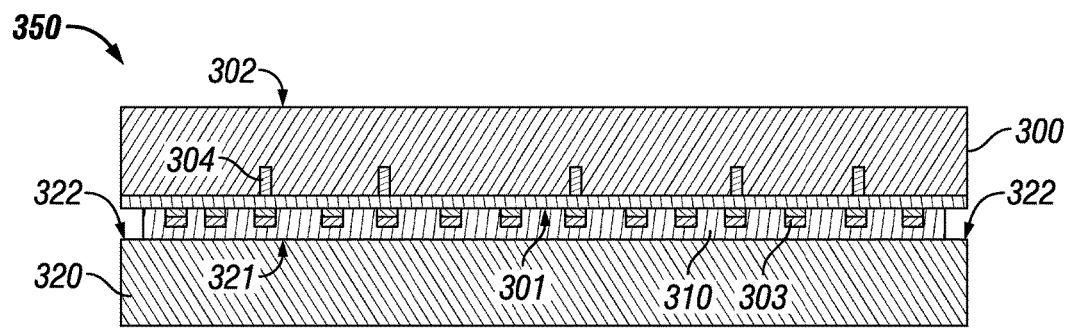
Figure 3D:
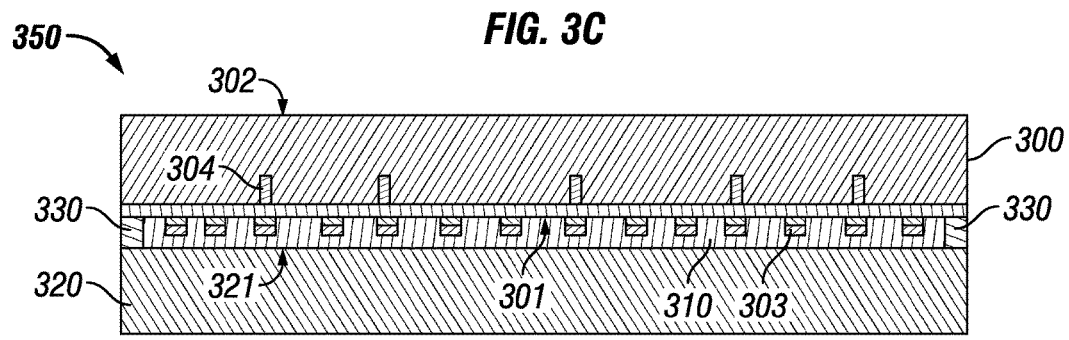

FIG. 3A shows an embodiment of a semiconductor device 300 having a first side 301 and a second side 302 that may be used to form a semiconductor device assembly 350 (as shown in FIG. 3C and FIG. 3D). The first side 301 of the semiconductor device 300 may include various features, such as pads 303 and vias 304, as discussed herein. The pads 303 and vias 304 are shown for illustrative purposes only.

FIG. 3B shows an embodiment of a substrate 320 having a first or top side 321. A filler material 310 has been deposited onto the first side 321 of the substrate 320. The filler material 310 does not extend to end or the substrate 321 or cover an outer edge 322 of the first side 321 of the substrate 320. As discussed herein, the filler material 310 may be deposited on the first side 321 of the substrate 320 in such a way that it is not deposited onto the outer edge 322. For example, a temporary structure may be placed on the outer edge 322 of the substrate while the filler material 310 is deposited onto the first side 321 of the substrate. Alternatively, the portion of the filler material 310 may be removed from the outer edge 322 of the substrate 320 after it is deposited, as discussed herein.

FIG. 3C shows a first side 301 of a semiconductor device 300 positioned adjacent to the first side 321 of the substrate 320 to form a semiconductor device assembly 350. The filler material 310 supports the first side 301 of the semiconductor device 300 on the first side 321 of the substrate 320. As discussed herein, the filler material 310 does not adhere and/or bond to either the semiconductor device 300 or the substrate 320. The filler material 310 may be comprised of a fine, granular material, such as various powders as would be appreciated by one of ordinary skill in the art having the benefit of this disclosure.

FIG. 3D shows an adhesive and/or epoxy 330 that is applied to the outer edge 322 (shown in FIG. 3C) of the substrate 320 and/or semiconductor device 300 to bond the semiconductor device 300 to the substrate 320 to form a semiconductor device assembly 350. The adhesive and/or epoxy may be a permanent adhesive. The filler material 310 on the substrate 320 supports the semiconductor device 300 while together as the semiconductor device assembly 350 permitting additional processing on the second or back side 302 of the semiconductor device 300, as discussed herein. After completion of the processing on the second side 302 of the semiconductor device 300, the outer edge of the semiconductor device 300 may be cut off to release the semiconductor device 300 from the substrate 320, as discussed herein.

Figure 4A:
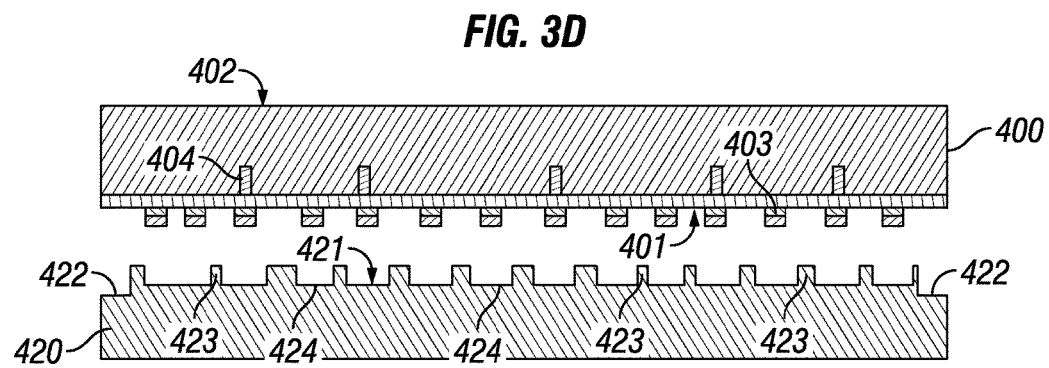
FIGS. 4A-4B show various elements of one embodiment of a temporary semiconductor device assembly.

FIG. 4A shows a first side 401 of a semiconductor device 400 positioned above a first side 421 of the substrate 420. The first side 401 of the semiconductor device 400 may include various features, such as pads 403 and vias 404, as discussed herein. The pads 403 and vias 404 are shown for illustrative purposes only. The first side 421 of the substrate 400 may include a topography that substantially corresponds to a topography of the first side 401 of the semiconductor device 400. For example, the first side 421 of the substrate 400 may include a plurality of structures, such as standoffs 423 and recesses 424, that are aligned with corresponding structures so that when placed together the standoffs 423 provide support structure to the first side 401 of the semiconductor device 400 and the recesses 423 provide air gaps 425 (as shown in FIG. 4B) between the first side 421 of the substrate 420 and various structures on the first side 401 of the semiconductor device 400.

The outer edge 422 of the first side 421 substrate 420 may be configured for the application of an adhesive 430 (shown in FIG. 4B) to bond the semiconductor device 400 to the substrate 420, as discussed herein. A non-adhesive coating may be applied to the first side 401 of the semiconductor device 400 prior to positioning the first side 401 of the semiconductor device 400 on the first side 421 of the substrate 400. The non-adhesive coating may help to protect the first side 401 of the semiconductor 400 as it is positioned against the first side 421 of the substrate 420.

Figure 4B:
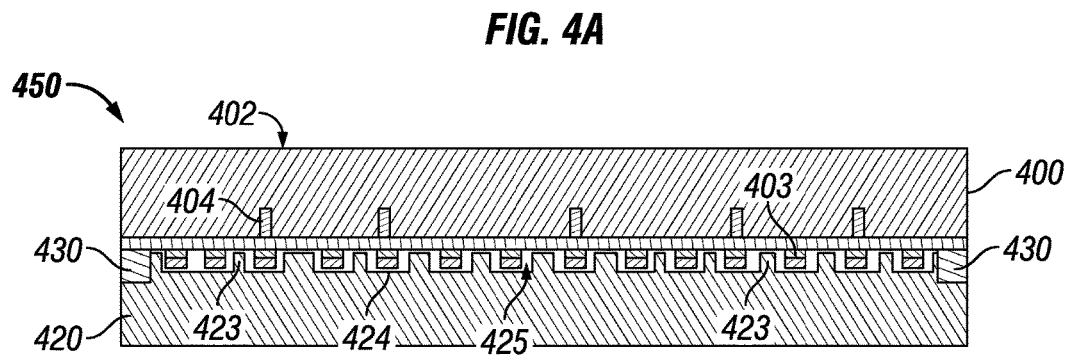

FIG. 4B shows the first side 421 semiconductor device 400 bonded to the outer edge of the first side 421 of the substrate 420 by adhesive and/or epoxy 430 to form a semiconductor device assembly 450. The adhesive 430 may be a permanent adhesive and may be located only on the outer edge 422 of the semiconductor device assembly 450. The standoffs 423 and recess 424 may eliminate the need to use a filler material to support the semiconductor device 400 on the substrate 420. The standoffs 423 may provide adequate support whereas the recesses 424 may provide air gaps 425 that may help to prevent damage to structures and/or features on the first side 401 of the semiconductor device 400 while bonded together at the outer edge to the substrate 420 to form a semiconductor device assembly 450. The semiconductor device assembly 450 permits additional processing on the second or back side 402 of the semiconductor device 400, as discussed herein. After completion of the processing on the second side 402 of the semiconductor device 400, the outer edge of the semiconductor device 400 may be cut off to release the semiconductor device 400 from the substrate 420, as discussed herein.

Figure 5:
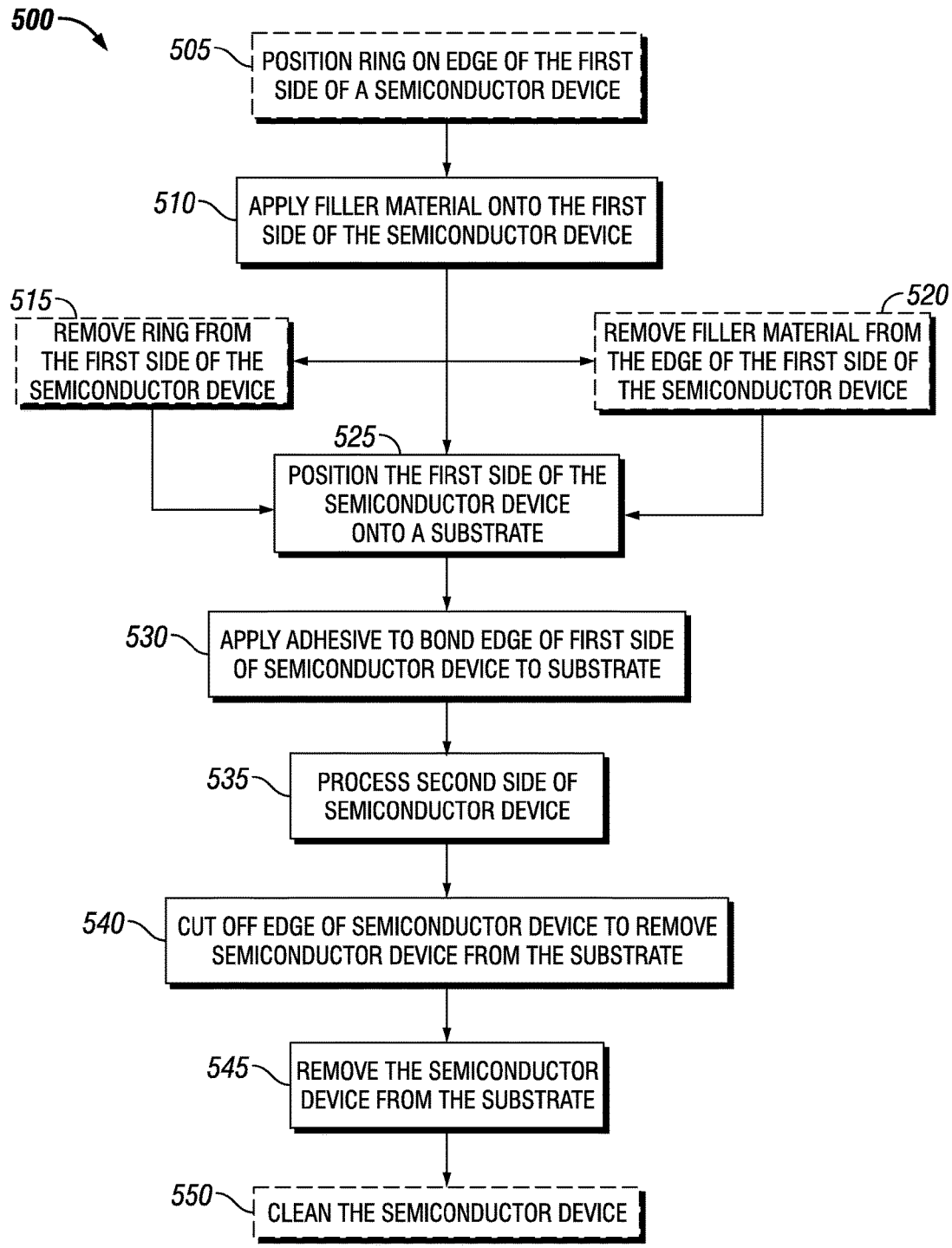
FIG. 5 is a flow chart of one embodiment of a method of forming a temporary semiconductor device assembly.

FIG. 5 shows a flow chart for one embodiment of a method 500 of forming a semiconductor device assembly. The method includes applying a filler material onto a first side of a semiconductor device, at step 510. As discussed herein, the filler material is deposited in such a way that the filler material does not cover the outer edge of the semiconductor device. Various methods may be taken to either ensure that the filler material does not cover the outer edge and/or is removed from the outer edge of the semiconductor device. Optionally, a ring may be positioned on the out edge of the first of the semiconductor device, at step 505, to prevent the filler material from covering the outer edge. If a ring was positioned on the first side of the semiconductor device, the ring is removed from the first side of the semiconductor device, at step 515. Alternatively, filler material is removed from the edge of the first side of the semiconductor device, at optional step 520.

At step 525, the method 500 includes positioning the first side of the semiconductor device onto or adjacent to a substrate. As discussed herein, the filler material supports the semiconductor device on the substrate. Alternatively, the ring or filler material may be removed from the outer edge after the semiconductor device is placed onto the substrate as would be appreciated by one of ordinary skill in the art having the benefit of this disclosure. The method 500 includes applying an adhesive to bond the outer edge of the first side of the semiconductor device to the substrate, at step 530, to form a semiconductor device assembly. The second side of the semiconductor device is then processed, at step 535. After the second side of the semiconductor device has been processed, the method 500 includes cutting off the outer edge of the semiconductor device to remove the semiconductor device form the substrate, at step 540. At step 545, the semiconductor device is removed and the semiconductor device is cleaned, at optional step 550.

Figure 6:
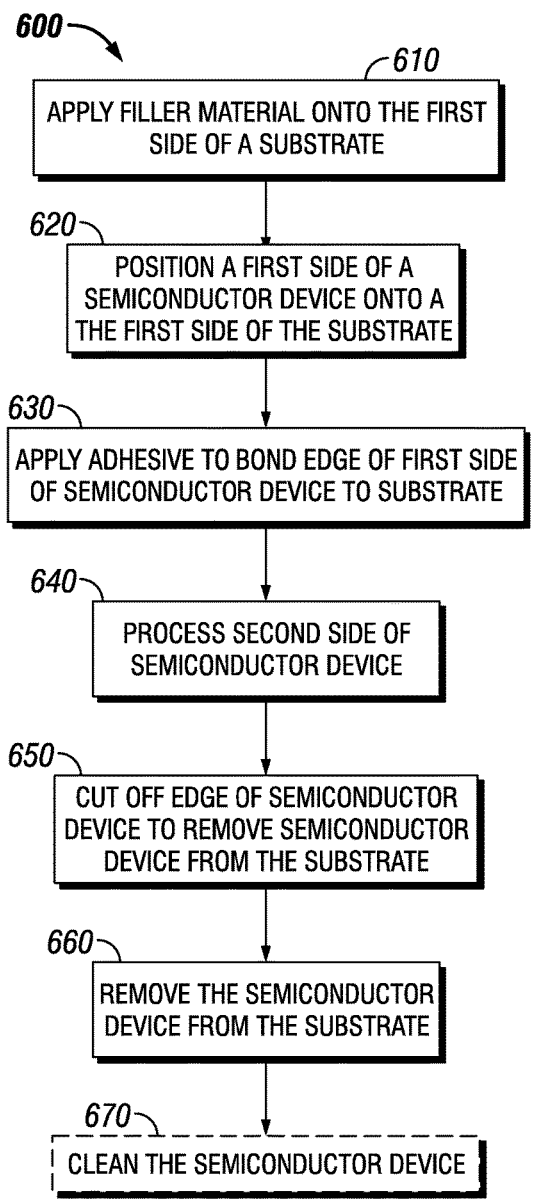
FIG. 6 is a flow chart of one embodiment of a method of forming a temporary semiconductor device assembly.

FIG. 6 shows a flow chart for one embodiment of a method 600 of forming a semiconductor device assembly. The method includes applying a filler material onto a first side of a substrate, at step 610. At step 620, the method 600 includes positioning a first side of a semiconductor device onto or adjacent the substrate. As discussed herein, the filler material supports the semiconductor device on the substrate. The method 600 includes applying an adhesive to bond the outer edge of the first side of the semiconductor device to the substrate, at step 630, to form a semiconductor device assembly. The second side of the semiconductor device is then processed, at step 640. After the second side of the semiconductor device has been processed, the method 600 includes cutting off the outer edge of the semiconductor device to remove the semiconductor device form the substrate, at step 650. At step 660, the semiconductor device is removed and the semiconductor device is cleaned, at optional step 670.

Figure 7:
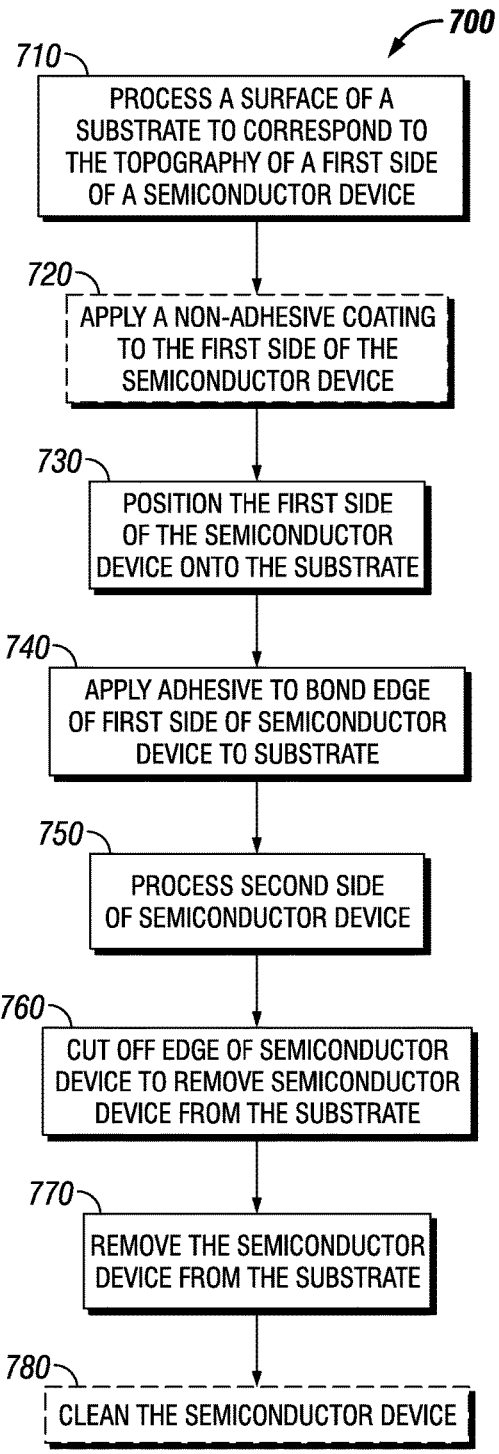
FIG. 7 is a flow chart of one embodiment of a method of forming a temporary semiconductor device assembly.

FIG. 7 shows a flow chart for one embodiment of a method 700 of forming a semiconductor device assembly.

The method includes processing a top surface of a substrate to substantially correspond to the topography of a first side of a semiconductor device, at step 710. Optionally, the method 700 may include applying a non-adhesive coating to first side of the semiconductor device, at step 720. The non-adhesive coating may help to protect the semiconductor device when it is positioned onto the first side of the substrate. At step 730, the method 700 includes positioning the first side of a semiconductor device onto or adjacent the substrate. As discussed herein, the topography of the substrate may be configured to support the semiconductor device. The method 700 includes applying an adhesive to bond the outer edge of the first side of the semiconductor device to the substrate, at step 740, to form a semiconductor device assembly. The second side of the semiconductor device is then processed, at step 750. After the second side of the semiconductor device has been processed, the method 700 includes cutting off the outer edge of the semiconductor device to remove the semiconductor device form the substrate, at step 760. At step 770, the semiconductor device is removed and the semiconductor device is cleaned, at optional step 780.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A method of forming a semiconductor device assembly, the method comprising:
    applying a filler material on a first side of a semiconductor device;
    positioning the first side of the semiconductor device adjacent to a substrate;
    applying an adhesive between an outer edge of the first side of the semiconductor device and the substrate to bond a portion of the semiconductor device to the substrate;
    processing on a second side of the semiconductor device, wherein processing on the second side of the semiconductor device reduces a thickness of the semiconductor device;
    cutting off the outer edge of the semiconductor device onto which adhesive was applied to release the semiconductor device from the substrate.

2. The method of claim 1, wherein the adhesive is only applied to an outer edge of the semiconductor device, with respect to the semiconductor device.

3. The method of claim 1, further comprising removing the semiconductor device from the substrate and cleaning the first side of the semiconductor device.

4. The method of claim 1, furthering comprising removing filler material from an outer edge of the semiconductor device prior to applying the adhesive.

5. The method of claim 4, wherein removing filler material from the outer edge of the semiconductor device further comprises removing all of the filler material within a first distance of the outer edge of the semiconductor device.

6. The method of claim 5, wherein the first distance is five (5) mm or less.

7. The method of claim 5, wherein a second distance from the outer edge is cut off of the semiconductor device during the cutting off the outer edge of the semiconductor device.

8. The method of claim 7, wherein the second distance is equal to or greater than the first distance.

9. The method of claim 1, further comprising positioning a ring on an outer edge of the semiconductor device prior to applying the filler material.

10. The method of claim 9, further comprising applying pressure to the semiconductor device and substrate assembly prior to applying the adhesive, wherein the pressure causes the filler material to fill a space between semiconductor device, the substrate, and the ring.

11. The method of claim 10, further comprising removing the ring from the outer edge of the semiconductor device prior to applying the adhesive.

12. A method of forming a semiconductor device assembly, the method comprising:
    applying a filler material onto a substrate;
    positioning a first side of the semiconductor device adjacent to the substrate;
    applying an adhesive between an outer edge the first side of the semiconductor device and the substrate to bond a portion of the semiconductor device to the substrate;
    processing on a second side of the semiconductor device, wherein processing on the second side of the semiconductor device reduces a thickness of the semiconductor device;
    cutting off the outer edge of the semiconductor device onto which adhesive was applied to release the semiconductor device from the substrate.

13. The method of claim 12, further comprising:
    applying pressure to the semiconductor device and substrate assembly prior to applying the adhesive, wherein the pressure causes the filler material to fill a space between semiconductor device and the substrate;
    removing the semiconductor device from the substrate; and
    cleaning the first side of the semiconductor device.

14. The method of claim 1, wherein the processing on the second side of the semiconductor device further comprises applying chemical mechanical planarization, grinding, or dry etching to the second side of the semiconductor device.

15. The method of claim 1, wherein the processing on the second side of the semiconductor device further comprises forming a plurality of structures on the second side of the semiconductor device.

16. The method of claim 12, wherein the processing on the second side of the semiconductor device further comprises applying chemical mechanical planarization, grinding, or dry etching to the second side of the semiconductor device.

17. The method of claim 12, wherein the processing on the second side of the semiconductor device further comprises forming a plurality of structures on the second side of the semiconductor device.

* * * * *